United States Patent
Arnsdorff et al.

(10) Patent No.: US 12,140,634 B2
(45) Date of Patent: Nov. 12, 2024

(54) CONTINUOUSLY MONITORED REMOTE POWER SHUTDOWN

(71) Applicant: Siemens Medical Solutions USA, Inc., Malvern, PA (US)

(72) Inventors: Carl Eric Arnsdorff, Knoxville, TN (US); Ryan Hurrell, Knoxville, TN (US); Garrett Sexton, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 251 days.

(21) Appl. No.: 17/597,513

(22) PCT Filed: Jul. 8, 2020

(86) PCT No.: PCT/US2020/070244
§ 371 (c)(1),
(2) Date: Jan. 10, 2022

(87) PCT Pub. No.: WO2021/035232
PCT Pub. Date: Feb. 25, 2021

(65) Prior Publication Data
US 2022/0252668 A1    Aug. 11, 2022

Related U.S. Application Data

(60) Provisional application No. 62/889,243, filed on Aug. 20, 2019.

(51) Int. Cl.
*G01R 31/327* (2006.01)
*G01R 19/00* (2006.01)
*G08B 21/18* (2006.01)

(52) U.S. Cl.
CPC ....... *G01R 31/327* (2013.01); *G01R 19/0092* (2013.01); *G08B 21/185* (2013.01)

(58) Field of Classification Search
CPC .. G01R 31/327; G01R 19/0092; G01R 19/00; G08B 21/185; H02J 13/00002
See application file for complete search history.

(56) References Cited

U.S. PATENT DOCUMENTS

| | | | |
|---|---|---|---|
| 6,473,281 B1 | 10/2002 | Kornblit | |
| 6,807,035 B1 * | 10/2004 | Baldwin | H02H 3/335 361/45 |
| 8,085,516 B1 | 12/2011 | Armstrong | |
| 10,340,678 B1 * | 7/2019 | Sorenson | H01H 71/123 |
| 11,552,500 B2 * | 1/2023 | Rao | H02J 13/00001 |

(Continued)

OTHER PUBLICATIONS

International Search Report Received for Corresponding PCT Application No. PCT/US2020/070244, dated Oct. 2, 2020.

*Primary Examiner* — Akm Zakaria

(57) ABSTRACT

A framework for continuously monitored remote power shutdown. In accordance with one aspect, a monitoring circuit (107, 207) is coupled to a power removal circuit (101). The monitoring circuit (107, 207) may generate an output signal indicative of circuit integrity based on one or more electrical characteristics of the power removal circuit (101). A notification system (110) may further be coupled to the monitoring circuit (107, 207). The notification system (110) may generate a notification (112) based on the output signal.

19 Claims, 3 Drawing Sheets

(56) References Cited

U.S. PATENT DOCUMENTS

| | | | |
|---|---|---|---|
| 2009/0212975 A1* | 8/2009 | Ausman | G01R 31/3277 |
| | | | 340/945 |
| 2014/0278157 A1 | 9/2014 | Simonin | |
| 2017/0201087 A1 | 7/2017 | Liu | |
| 2017/0213680 A1* | 7/2017 | Simonin | H01H 71/04 |
| 2018/0057917 A1 | 3/2018 | Hase | |
| 2018/0095123 A1* | 4/2018 | Biswas | H02J 13/00002 |
| 2019/0326744 A1* | 10/2019 | Sorenson | H02H 3/105 |
| 2020/0083012 A1* | 3/2020 | Fasano | H01H 83/226 |

* cited by examiner

CONTINUOUSLY MONITORED REMOTE POWER SHUTDOWN

CROSS-REFERENCE TO RELATED APPLICATION

The present application claims the benefit of U.S. provisional application No. 62/889,243 filed Aug. 20, 2019, the entire contents of which are herein incorporated by reference.

TECHNICAL FIELD

The present disclosure generally relates to power management, and more particularly to continuously monitored remote power shutdown.

BACKGROUND

Remote power shutdown (also known as Emergency Power Off or EPO) is typically provided as a safety measure for quickly disconnecting electrical power to a particular piece of equipment (e.g., diagnostic image scanner) in the event of an emergency. Such emergency event may occur in an immediately hazardous situation that needs to be ended or averted quickly in order to prevent injury or damage. A remote actuator (e.g., Remote Power Off or RPO, Emergency Power Off or EPO) may be used to facilitate remote removal of power, and allow all power to be shut down safely from a central location.

Remote power shutdown may be achieved using a continuously powered circuit or non-continuously powered circuit. A continuously powered circuit requires continuous energization of a trip device. This unfortunately results in system shutdown during brief power losses, and a non-operational equipment or system when there is a circuit fault. Additionally, such design may require additional hardware and cost, which needs to be added to maintain power on. Higher power circuits require additional current draw to maintain power to the equipment. Increasingly larger sized components and multiphase systems are also required, which add additional hardware requirements as well as hardware and operational costs.

A non-continuously powered circuit, on the other hand, applies power to a trip device only during activation to remove power to the equipment. Although this solution allows continued operation of the equipment during a circuit fault (e.g., disconnection due to wire break or coil burnout), the circuit fault is not known until the emergency shutdown requires it to operate. This results in a failure to remove power during the emergency, thereby creating a hazardous situation. Operational verification requires additional costs for testing, equipment downtime and personnel.

SUMMARY

Described herein is a framework for continuously monitored remote power shutdown. In accordance with one aspect, a monitoring circuit is coupled to a power removal circuit. The monitoring circuit may generate an output signal indicative of circuit integrity based on one or more electrical characteristics of the power removal circuit. A notification system may further be coupled to the monitoring circuit. The notification system may generate a notification based on the output signal.

BRIEF DESCRIPTION OF THE DRAWINGS

A more complete appreciation of the present disclosure and many of the attendant aspects thereof will be readily obtained by reference to the following detailed description when considered in connection with the accompanying drawings.

DETAILED DESCRIPTION

Figure 1:
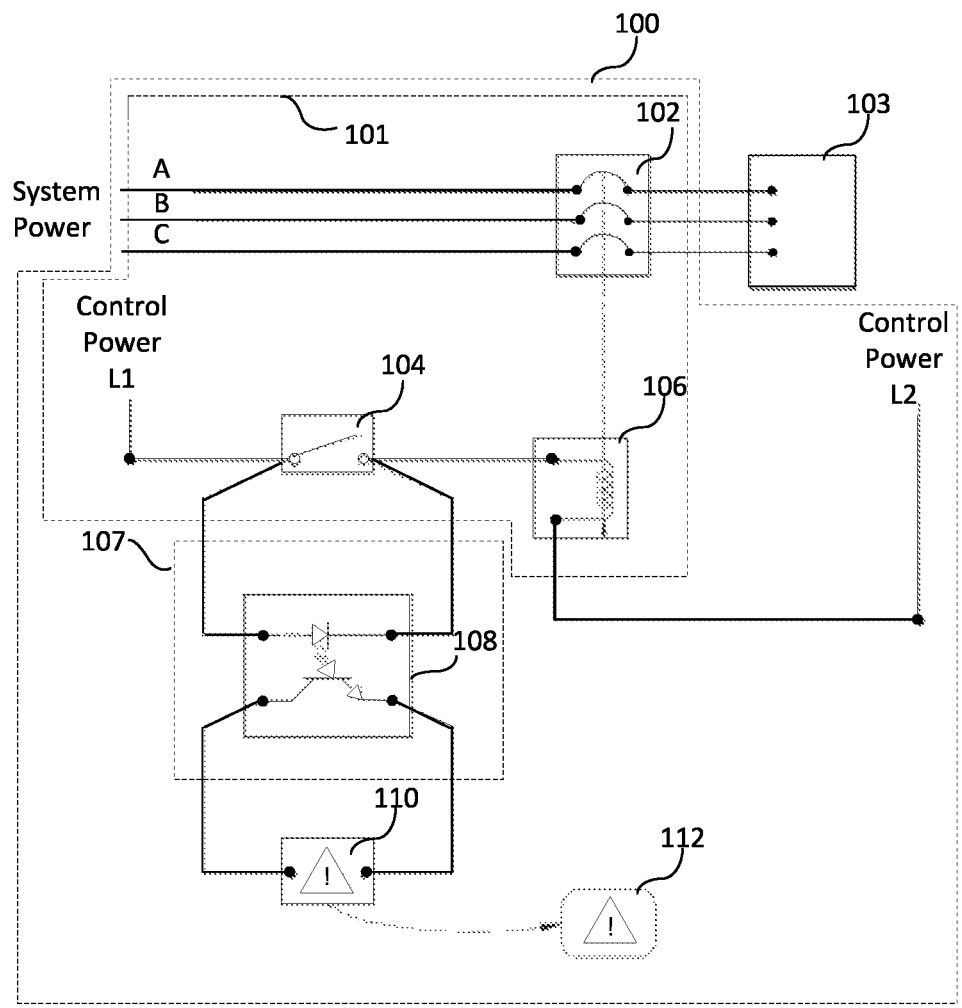
FIG. 1 shows an exemplary remote power shutdown system.

In the following description, numerous specific details are set forth such as examples of specific components, devices, methods, etc., in order to provide a thorough understanding of implementations of the present framework. It will be apparent, however, to one skilled in the art that these specific details need not be employed to practice implementations of the present framework. In other instances, well-known materials or methods have not been described in detail in order to avoid unnecessarily obscuring implementations of the present framework. While the present framework is susceptible to various modifications and alternative forms, specific embodiments thereof are shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention. Furthermore, for ease of understanding, certain method steps are delineated as separate steps; however, these separately delineated steps should not be construed as necessarily order dependent in their performance.

A framework for a continuously monitored remote power shutdown is described herein. In accordance with one aspect, the framework includes a monitoring circuit that continuously monitors circuit integrity of a non-continuously powered power removal circuit and provides automated notification of circuit status. The present framework provides the benefits of the continuously powered and non-continuously powered circuits without the associated issues, such as system unavailability during brief power losses, failure to remove power during emergencies due to faulty power removal circuits, partial circuit monitoring, high operational and hardware costs, and so forth.

The present framework advantageously provides power removal even with a faulty power removal circuit. Additionally, the framework continuously monitors all the elements in the power removal circuit, including elements (e.g., trip device) that are described herein as well as any additional elements that are not described herein. Notification of any circuit faults or conditions may be immediately issued. The present framework may ride through brief power losses, thereby allowing the power removal circuit to remain operational to effect an emergency power shutdown. Advantageously, there is an absence of nuisance trips during brief power losses. Moreover, minimal hardware is required and minimal additional power is needed to implement the present framework. In addition, high reliability of the remote power shutdown function is achieved. These and other exemplary features and advantages will be described herein.

FIG. 1 shows an exemplary remote power shutdown system 100. Remote power shutdown system 100 is coupled to a powered equipment (or system) 103. Equipment 103 receives three-phase system power via power lines A, B and C. It should be appreciated that although remote power shutdown system 100 is shown as a three-phase alternating current (AC) circuit, the present framework is also applicable to other types of circuits including, but not limited to, single phase, two phase, split phase, direct current (DC), or a combination thereof.

Equipment 103 may be any powered system that may require power removal or electronic stopping in the event of, for example, an emergency. For instance, equipment 103 may be an industrial curing press, industrial furnace or elevator. Equipment 103 may also be a medical imaging modality that acquires medical image data. Such medical imaging modality may be a radiology or nuclear medicine imaging scanner. Such medical imaging modality may acquire the medical image data by magnetic resonance (MR) imaging, computed tomography (CT), helical CT, x-ray, positron emission tomography (PET), PET-CT, fluoroscopy, ultrasound or single photon emission computed tomography (SPECT). Other types of imaging modalities or equipment may also be used.

In some implementations, remote power shutdown system 100 includes a power removal circuit 101 coupled to a monitoring circuit 107. Power removal circuit 101 enables remote triggering of a power shutdown of the powered equipment 103. In some implementations, power removal circuit 101 includes a disconnector (or breaker) 102 and an actuator 104 coupled to a trip device 106. When the actuator 104 is activated, control power becomes available to and activates the trip device 106, which then activates (e.g., opens the contacts) the disconnector 102, thereby removing system power to equipment 103. While FIG. 1 illustrates a single actuator 104 and a single trip device 106, it should be appreciated that multiple instance of each may be provided. Additionally, one or more elements other than those depicted in FIG. 1 may be provided.

Disconnector 102 may include, but is not limited to, a power disconnector, breaker, contacts of a contactor, relay, or a combination thereof. Actuator 104 may be, for example, a remote actuator, such as an RPO or EPO button. Actuator 104 may include one or more actuator contacts (e.g., relay contact, contactor contact, breaker auxiliary contact), a solid state transistor-based switch, or a combination thereof. For example, actuator 104 may include a relay with normally open (NO) contacts actuated by a series of normally closed (NC) contacts in an RPO station.

Trip device 106 may include at least one electromagnetic coil that is non-continuously powered by control power lines 1 and 2 (L1, L2). Control power is applied to the trip device 106 only upon activation of the actuator 104. When the actuator 104 is activated by the control power, trip device 106 receives the control power and actuates (or applies control power to) the disconnector 102 to remove system power to the equipment 103. Advantageously, since the trip device 106 is non-continuously powered, a brief power loss does not actuate the disconnector 102. Equipment 103 may ride through and remain operational during brief power losses.

Trip device 106 may include, but is not limited to, a shunt trip, a motorized breaker, contactor, power shutdown circuit of an uninterruptible power supply (UPS), undervoltage trip (UVT) circuit, or a combination thereof. It should be appreciated that the control power may be any type of power, such as alternating current (AC) power, direct current (DC) power, single-phase power, multi-phase power, or a combination thereof. The power may include any frequency or voltage level with the appropriate choice of the component(s) of the monitoring circuit 107.

Monitoring circuit 107 is coupled to actuator 104 to continuously monitor the power removal circuit 101 and provide an output signal that may be indicative of circuit integrity (or continuity). Monitoring circuit 107 advantageously enables equipment 103 to remain operational in the event of a fault in the power removal circuit 101, while providing a high reliability of the power shutdown function in the event of an emergency. In some implementations, monitoring circuit 107 is coupled across the normally open contacts of actuator 104 to provide circuit integrity indication. Circuit integrity generally refers to the operability of the power removal circuit 101 during activation of the actuator 104 in the event of, for example, an emergency that requires power shutdown for equipment 103. Circuit integrity may be impacted by, for example, line breaks, as well as coil integrity and/or coil burn-out in trip device 106.

Monitoring circuit 107 generates an output signal that is indicative of circuit integrity based on one or more electrical characteristics of the power removal circuit 101. The output signal may be, for example, a discrete signal that represents a circuit status of the power removal circuit 101. For example, when the output signal is "off" (or at a predetermined low level), it may indicate a fault status. When the output signal is "on" (or at a predetermined high level), it may indicate an operational or normal status. The electrical characteristics of the power removal circuit 101 may include, but are not limited to, a closed loop current, a closed loop voltage, a frequency, or a combination thereof.

In some implementations, monitoring circuit 107 includes a high impedance (or low current) device 108 to generate the output signal. The high impedance device 108 may include, but is not limited to, a high impedance switch, relay, optical isolator or a combination thereof. For example, high impedance device 108 is a solid-state relay with optical isolation. The high impedance device 108 may be de-energized in response to a fault occurring in the power removal circuit 101, thereby producing a low output signal that is provided to a notification system 110.

Monitoring circuit 107 is coupled to the notification system 110 to automatically generate notification 112 based on the output signal. Notification system 110 may be a computer system, an alarm circuit or any other system capable of generating a notification 112 based on the output signal. Notification system 110 may be coupled to the high impedance device 108 to receive the output signal. The notification 112 may inform the user (or system) of the status (e.g., fault or operational status) of the power removal circuit 101. The notification 112 may include, for example, a visual alarm, an audible alarm, electronic text message, electronic mail message, or a combination thereof. The notification 112 may also be communicated to a monitoring system (not shown) associated with the powered equipment 103 to perform one or more actions in response to the notification 112.

Advantageously, circuit faults in the entire power removal circuit 101 may be continuously and automatically monitored by the monitoring circuit 107. The user (or system) may be notified immediately of a fault condition in the power removal circuit 101, so that action may be taken to correct the fault. The circuit 100 advantageously requires minimal hardware, thereby reducing the cost, size and installation effort. Additionally, minimal additional power is required. High reliability of the remote power shutdown function is achieved in the event of an emergency.

Figure 2:
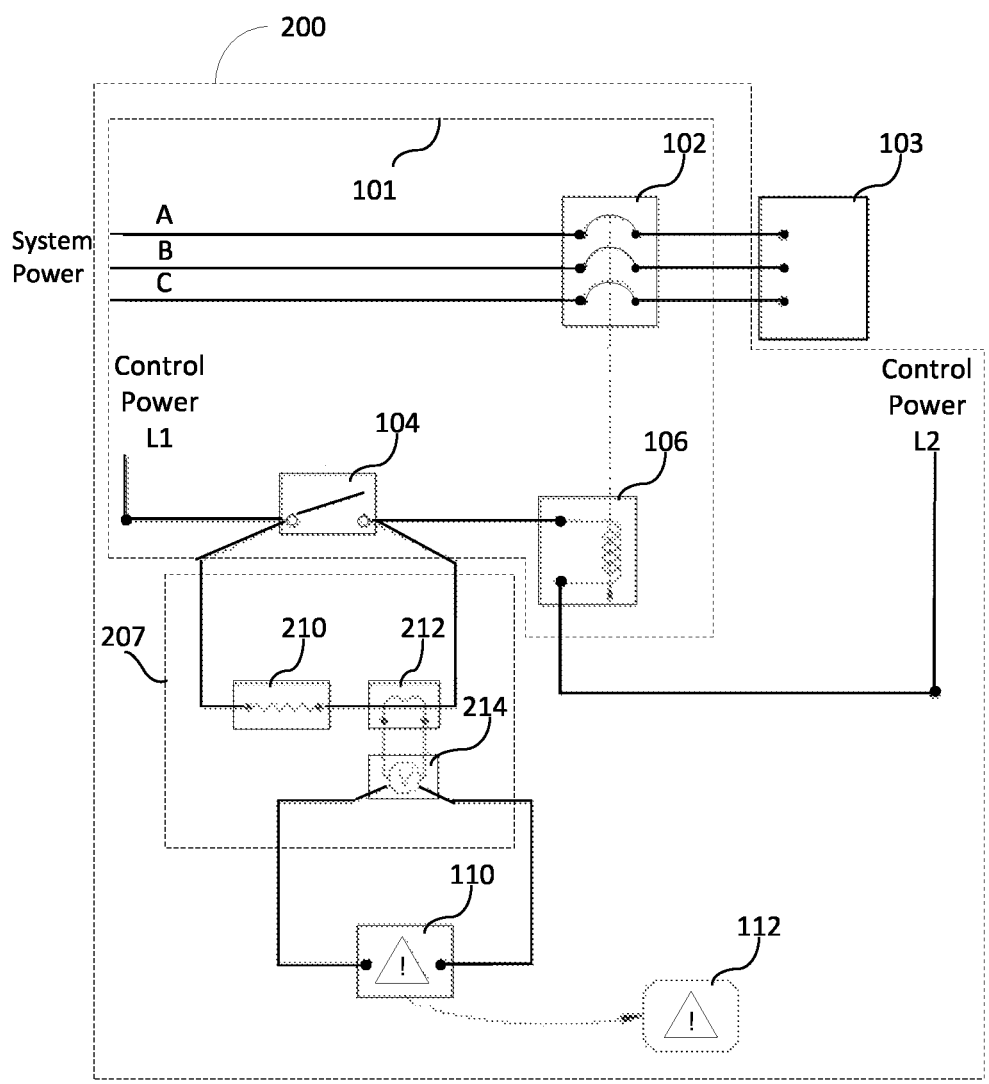
FIG. 2 shows another exemplary remote power shutdown system.

FIG. 2 shows another exemplary remote power shutdown system 200. Remote power shutdown system 200 is coupled to a powered equipment 103. Remote power shutdown system 200 includes a power removal circuit 101 coupled to a monitoring circuit 207. Power removal circuit 101 enables remote triggering of a power shutdown of the powered equipment 103. In some implementations, power removal circuit 101 includes a disconnector (or breaker) 102 and an actuator 104 coupled to a trip device 106. When the contacts in the actuator 104 close, current becomes available to the trip device 106, which then opens the contacts in the disconnector 102, thereby removing system power to equipment 103.

Monitoring circuit 207 is coupled to actuator 104 to continuously monitor the circuit 101 and provides an output signal that is indicative of full circuit integrity (or continuity) based on one or more electrical characteristics of the power removal circuit 101. In some implementations, monitoring circuit 207 is coupled across the normally open contacts of actuator 104 to provide circuit integrity indication. Monitoring circuit 207 may include a high impedance (or low current) device 210 and a current transformer 212 coupled across the actuator 104. High impedance (or low current) device 210 may include, for example, a current limiting resistor, a relay coil, or a combination thereof. A current meter 214 may be coupled across the current transformer 212 for measuring the current and generate the output signal. The output signal of the current meter 214 is indicative of the circuit integrity (or circuit status) of the power removal circuit 101. Accordingly, monitoring circuit 207 continuously and automatically monitors the power removal circuit 101 (e.g., trip device 106) and provides verification of circuit integrity, while allowing the powered equipment 103 to remain operational in the event of a circuit fault and providing high reliability of power shutdown function in the event of an emergency.

Monitoring circuit 207 is coupled to a notification system 110 to provide automatic user notification 112 of a circuit fault. Notification system 110 may be coupled to the current meter 214 to receive its output and generate the user notification 112 based on the output signal. The output signal may be, for example, a discrete signal that represents a circuit fault status when "off" (or a predetermined low level) and an operational circuit status when "on" (or at a predetermined high level). The output signal may be monitored by notification system 110, which reports a notification 112 to the user. The user notification 112 may include, for example, a visual alarm, an audible alarm, electronic text message, electronic mail message, or a combination thereof.

Figure 3:
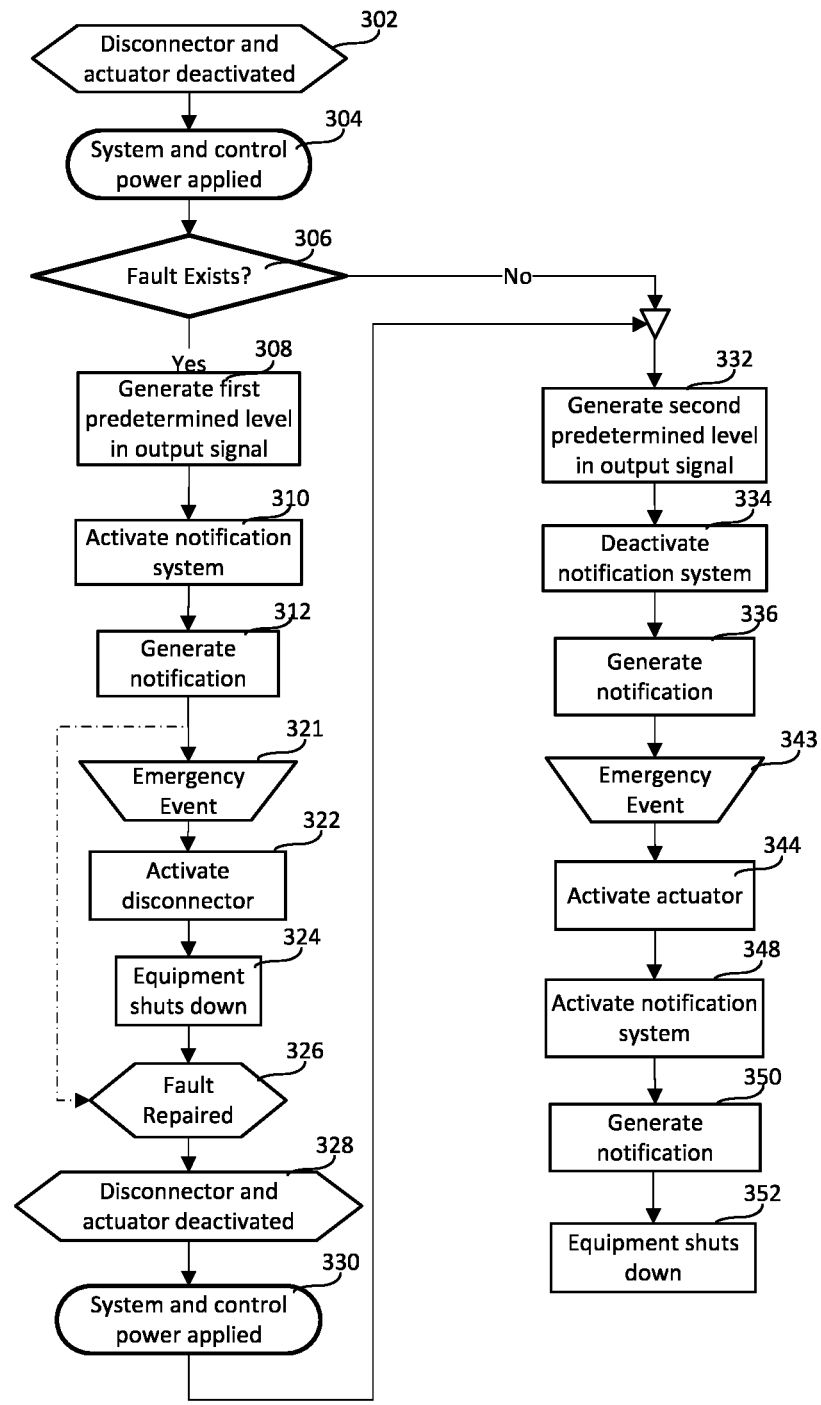
FIG. 3 shows an exemplary method of continuously monitoring remote power shutdown.

FIG. 3 shows an exemplary method 300 of continuously monitoring remote power shutdown. It should be understood that the steps of the method 300 may be performed in the order shown or a different order. Additional, different, or fewer steps may also be provided. Further, the method 300 may be implemented with the system 100 of FIG. 1, system 200 of FIG. 2, a different system, or a combination thereof.

At 302, disconnector 102 is deactivated and actuator 104 is also deactivated. At 304, system power and control power are applied to the remote power shutdown system (100 or 200). Equipment 103 receives system power via the deactivated (e.g., closed) disconnector 102. At 306, if no fault exists in power removal circuit 101, method 300 proceeds to 332. If a fault exists, method 300 proceeds to 308.

At 308, monitoring circuit (107 or 207) generates a first predetermined level of an output signal based on one or more electrical characteristics of power removal circuit 101. For example, high impedance device 108 may change state from a high to a low output signal in response to an occurrence of a fault. At 310, notification system 110 is activated in response to the first predetermined level of the output signal. At 312, in response to activation, notification system 110 generates a notification 112 indicating the fault status of the power removal circuit 101. During this fault event, trip device 106 is deactivated and disconnector 102 remains deactivated (e.g., closed), thereby allowing system power to pass through to equipment 103. Therefore, equipment 103 remains powered and operational, and does not shut down with the power removal circuit 101.

If no emergency event occurs, the method 300 may continue directly from 312 to 326. If an emergency event occurs at 321, however, equipment 103 needs to be shut down. At 322, system power may be removed from the equipment 103 by activating the disconnector 102, rather than remotely activating the actuator 104 of the power removal circuit 101. At 324, in response to activation of disconnector 102, system power is removed from the equipment 103 and equipment 103 shuts down. The fault in the power removal circuit 101 may be repaired during this emergency event.

At 326, the fault in the power removal circuit 101 is repaired and therefore fully functional. At 328, disconnector 102 and actuator 104 are deactivated. At 330, system power and control power are applied to the remote power shutdown system (100 and 200). System power then passes through to equipment 103.

At 332, when no fault in the power removal circuit 101 exists or the previous fault has been repaired, a second predetermined level of the output signal is generated based on the one or more electrical characteristics of the power removal circuit 101. For example, high impedance device 108 may be activated and sends a high output signal to the notification system 110 indicating that the power removal circuit 101 is operational. At 334, notification system 110 is deactivated in response to the second predetermined level of the output signal. At 336, in response to the deactivation, notification system 110 may send a notification 112 indicating that the remote power shutdown system is operational (i.e., operational or normal status). While there is no fault in the power removal circuit 101, trip device 106 is not powered when the actuator 104 is deactivated. Disconnector 102 is thereby deactivated (e.g., closed), allowing system power to pass through to equipment 103. Equipment 103 remains powered and operational. Trip device 106 may allow a small current flow which powers the high impedance monitoring device 108 but does not actuate the disconnector 102.

At 343, an emergency event occurs that requires equipment 103 to be shut down. At 344, since there is no fault in the power removal circuit 101, actuator 104 may be used by the user (or an external device) to remove system power from equipment 103. At 348, notification system 110 is activated in response to, for example, the deactivation (e.g., removal of control power) of high impedance device 108. At 350, in response to receiving, for example, a low output signal from the high impedance device 108, notification system 110 sends a notification 112 indicating that the actuator 104 is activated. During the emergency event, trip device 106 may receive control power and be activated, thereby activating (e.g., opening) disconnector 102. At 352, equipment 103 no longer receives system power and is successfully shut down.

While the present framework has been described in detail with reference to exemplary embodiments, those skilled in the art will appreciate that various modifications and substitutions can be made thereto without departing from the spirit and scope of the invention as set forth in the appended claims. For example, elements and/or features of different exemplary embodiments may be combined with each other and/or substituted for each other within the scope of this disclosure and appended claims.

What is claimed is:

1. A system comprising:
   a monitoring circuit coupled to a power removal circuit, wherein the monitoring circuit generates an output signal indicative of circuit integrity based on one or more electrical characteristics of the power removal circuit, wherein the power removal circuit includes a disconnector, an actuator and a trip device, wherein the trip device is powered by a control power only upon activation of the actuator and activates the disconnector to remove system power to an equipment in response to the activation, wherein the monitoring circuit comprises a high impedance device and a current transformer coupled across the actuator in the power removal circuit, and a current meter coupled across the current transformer to generate the output signal; and
   a notification system coupled to the monitoring circuit to receive the output signal, wherein the notification system generates a notification based on the output signal.

2. The system of claim 1 wherein the one or more electrical characteristics comprise a closed loop current, a closed loop voltage, a frequency or a combination thereof.

3. The system of claim 1 wherein the high impedance device is deactivated in response to a fault occurring in the power removal circuit.

4. The system of claim 1 wherein the high impedance device comprises a high impedance switch, a relay, an optical isolator or a combination thereof.

5. The system of claim 1 wherein the notification system is coupled to the high impedance device to receive the output signal.

6. The system of claim 1 wherein the output signal is a discrete signal that represents a circuit status.

7. The system of claim 1 wherein the notification comprises a visual alarm, an audible alarm, electronic text message, electronic mail message, or a combination thereof.

8. The system of claim 1 further comprising the power removal circuit coupled to the equipment, wherein the power removal circuit enables remote triggering of a power shutdown of the equipment.

9. The system of claim 1 wherein the disconnector comprises a power disconnector, breaker, contacts of a contactor, a relay, or a combination thereof.

10. The system of claim 1 wherein the actuator comprises actuator contacts, a solid state transistor-based switch, or a combination thereof.

11. The system of claim 1 wherein the trip device comprises a shunt trip, a motorized breaker, contactor, power shutdown circuit of an uninterruptible power supply (UPS), undervoltage trip (UVT) circuit, or a combination thereof.

12. A method comprising:
    generating, by a monitoring circuit, an output signal based on one or more electrical characteristics of a power removal circuit coupled to an equipment, wherein the power removal circuit includes a disconnector, an actuator and a trip device, wherein the trip device is powered by a control power only upon activation of the actuator and activates the disconnector to remove system power to the equipment in response to the activation, wherein the monitoring circuit comprises a high impedance device and a current transformer coupled across the actuator in the power removal circuit, and a current meter coupled across the current transformer to generate the output signal; and
    in response to a fault in the power removal circuit, generating a notification of fault status based on the output signal while deactivating the trip device to allow the system power to pass through to the equipment.

13. The method of claim 12 further comprising:
    in response to the fault in the power removal circuit and an emergency event, removing the system power from the equipment by activating the disconnector in the power removal circuit.

14. The method of claim 12 further comprising:
    in response to no fault in the power removal circuit, generating a notification of operational status based on the output signal.

15. The method of claim 12 further comprising:
    in response to no fault in the power removal circuit and an emergency event, removing the system power from the equipment by remotely activating the actuator in the power removal circuit.

16. A method comprising:
    continuously monitoring, by a monitoring circuit, a power removal circuit by generating an output signal indicative of circuit integrity based on one or more electrical characteristics of the power removal circuit, wherein the power removal circuit includes a disconnector, an actuator and a trip device, wherein the trip device is powered by a control power only upon activation of the actuator and activates the disconnector to remove system power to an equipment in response to the activation, wherein the monitoring circuit comprises a high impedance device and a current transformer coupled across the actuator in the power removal circuit, and a current meter coupled across the current transformer to generate the output signal; and
    generating a notification based on the output signal.

17. The method of claim 16 further comprising:
    in response to a fault in the power removal circuit and an emergency event, removing the system power from the equipment by activating the disconnector in the power removal circuit.

18. The method of claim 16 further comprising:
    in response to no fault in the power removal circuit, generating a notification of operational status based on the output signal.

19. The method of claim 16 further comprising:
    in response to no fault in the power removal circuit and an emergency event, removing the system power from the equipment by remotely activating the actuator in the power removal circuit.

* * * * *